US011682565B2

(12) United States Patent
Barros et al.

(10) Patent No.: US 11,682,565 B2
(45) Date of Patent: Jun. 20, 2023

(54) FLUID CONTROL SYSTEM

(71) Applicant: Ichor Systems, Inc., Fremont, CA (US)

(72) Inventors: Philip Ryan Barros, Pleasanton, CA (US); Greg Patrick Mulligan, Milpitas, CA (US); Chris Melcer, Santa Cruz, CA (US)

(73) Assignee: Ichor Systems, Inc.

( * ) Notice: Subject to any disclaimer, the term of this patent is extended or adjusted under 35 U.S.C. 154(b) by 129 days.

(21) Appl. No.: 17/393,468

(22) Filed: Aug. 4, 2021

(65) Prior Publication Data

US 2021/0366735 A1 Nov. 25, 2021

Related U.S. Application Data

(63) Continuation of application No. 15/899,365, filed on Feb. 19, 2018, now Pat. No. 11,094,563, which is a continuation of application No. PCT/US2016/047441, filed on Aug. 17, 2016.

(60) Provisional application No. 62/206,267, filed on Aug. 17, 2015.

(51) Int. Cl.
*H01J 37/32* (2006.01)
*H01L 21/67* (2006.01)
*H01L 21/677* (2006.01)

(52) U.S. Cl.
CPC .. *H01L 21/67017* (2013.01); *H01J 37/32449* (2013.01); *H01L 21/6715* (2013.01); *H01L 21/67161* (2013.01); *H01L 21/67739* (2013.01)

(58) Field of Classification Search
CPC .......... H01L 21/67017; H01L 21/6715; H01L 21/67161; H01L 21/67739; H01J 37/32449

USPC .......... 427/248.1, 255.23; 137/2, 3
See application file for complete search history.

(56) References Cited

U.S. PATENT DOCUMENTS

| 5,722,441 | A | 3/1998 | Teramoto |
| 5,943,230 | A | 8/1999 | Rinnen et al. |
| 6,766,818 | B2 | 7/2004 | Kashkoush et al. |
| 7,485,189 | B2 | 2/2009 | Satake et al. |

(Continued)

FOREIGN PATENT DOCUMENTS

| EP | 0640747 A | 3/1995 |
| JP | H01-174932 A | 7/1989 |

(Continued)

*Primary Examiner* — Rudy Zervigon
(74) *Attorney, Agent, or Firm* — The Belles Group, P.C.

(57) ABSTRACT

An improved fluid delivery system and method that directly controls the concentration of constituent components in a fluid mixture delivered, for example, to a process chamber. Pressure of the fluid mixture can also be directly controlled. A concentration sensor capable of measuring concentration of all of the constituent components in a fluid mixture is used to provide signals used to vary the flow rate of constituent gases under a closed loop feedback system. The signal output of one or more pressure sensors can also be used to provide a signal used to vary the flow rate of constituent gases under a closed loop feedback system. By directly controlling these two extremely important process variables, embodiments of the present invention provide a significant advantage in measurement accuracy over the prior art, enable real-time process control, reduce system level response time, and allow for a system with a significant footprint reduction.

20 Claims, 4 Drawing Sheets

(56) References Cited

U.S. PATENT DOCUMENTS

| | | | |
|---|---|---|---|
| 8,679,307 B2 | 3/2014 | Fischione et al. | |
| 2002/0022087 A1* | 2/2002 | Satake | C30B 25/165 |
| | | | 427/255.28 |
| 2002/0192369 A1* | 12/2002 | Morimoto | C23C 16/52 |
| | | | 118/712 |
| 2004/0050325 A1 | 3/2004 | Samoilov et al. | |
| 2015/0093741 A1 | 4/2015 | Swanda et al. | |

FOREIGN PATENT DOCUMENTS

| | | |
|---|---|---|
| JP | H06-252122 A | 9/1994 |
| JP | 2000-042527 A | 2/2000 |
| JP | 2001-234348 A | 8/2001 |
| JP | 2001-259400 A | 9/2001 |
| WO | WO2017/031257 A2 | 2/2017 |

* cited by examiner

FLUID CONTROL SYSTEM

CROSS-REFERENCE TO RELATED APPLICATIONS

This application is a continuation of U.S. application Ser. No. 15/899,365, filed on Feb. 19, 2018, which claims priority to PCT/US2016/047441, filed Aug. 17, 2016, which claims the benefit of U.S. Provisional Application 62/206,267, filed Aug. 17, 2015, which are incorporated herein by reference in their entireties.

FIELD OF THE DISCLOSURE

The present invention relates in general to methods and systems for controlling concentration and pressure for a fluid mixture, and more particularly to a fluid delivery system that directly controls the concentration of constituent components in a fluid mixture.

BACKGROUND

Precise control over fluid delivery is important in many industries. For example, the manufacture of semiconductors requires precise control of gasses for processes such as dry etching or deposition. Many other processes in the manufacture of semiconductors also require a precise reaction of two or more gases under controlled conditions. For these types of processing steps, the amount (usually expressed as pressure) and composition (expressed as either a ratio or in terms of concentration) of the fluid introduced into a processing chamber are critical parameters. Variations in pressure or in the concentration of constituent components in a fluid mixture can have profound effects upon these types of manufacturing processes. As the semiconductor industry continues to miniaturize semiconductor devices, the demand for accurate flow control of gases used in semiconductor manufacturing processes has become even more critical. Shorter manufacturing process times and more precise quantities and flow rates of gas are being required.

For modern semiconductor manufacturing, measurement and regulation of fluid flow is typically achieved by the use of one or more mass flow controllers (MFCs). Conventional mass flow controllers (MFCs) generally include four main portions: a flow meter, a control valve, a valve actuator, and a controller. The flow meter measures the mass flow rate of a fluid in a flow path and provides an electrical signal indicative of that flow rate. Typically, the flow meter may include a mass flow sensor and a bypass. The mass flow sensor measures the mass flow rate of fluid in a sensor conduit that is fluidly coupled to the bypass. The mass flow rate of fluid in the sensor conduit is related to the mass flow rate of fluid flowing in the bypass, with the sum of the two being the total flow rate through the flow path controlled by the mass flow controller. In operation, the flow rate is supplied to the MFC as a voltage signal. The signal is amplified, processed and supplied to the proportional control valve to modify the flow. To this end, the MFC includes a closed loop control system which compares the signal from the mass flow sensor to predetermined values and adjusts the proportional valve accordingly to achieve the desired flow.

Unfortunately, many problems exist with current technology mass flow controllers. MFCs must be calibrated and tuned for particular fluid types and particular flow levels, and such calibration and tuning is very time-consuming and labor intensive. Typical MFCs also suffer from inherent inaccuracies caused by factors such as signal drift, the necessity of using surrogate calibration fluids and operating conditions, and limited dynamic range. The use of multiple MFCs to control multiple gas constituents results in a greater system inaccuracy since the individual errors are additive.

Another significant problem with the use of MFCs in many applications is that mass flow through the system gas conduits, which is the variable being determined by the MFC device, is not actually a process variable that needs to be controlled. In many applications, the important process variables are the concentration of the constituent gases in a mixture and the overall pressure of the gas mixture in the process chamber. Gas concentration is only controlled indirectly by way of MFCs, while gas pressure must be controlled by a separate mechanism such as a throttle valve. This indirect control of the significant process variables reduces accuracy and efficiency, and thus reduces the overall performance of the fluid delivery system.

What is needed therefore is an improved system and method for controlling concentration and pressure of fluid mixtures in fluid delivery systems.

SUMMARY

In one aspect, embodiments of the invention provide a gas delivery system for a process chamber comprising a plurality of gas sources, each source providing gas of a different gas type; at least two adjustable control valves for controlling gas flow, each adapted to be disposed within a flow path from each of a plurality of gas sources, each source providing gas of a different gas type; a flow path downstream from said adjustable control valves through which gases from the plurality of gas sources are combined into a gas mixture and delivered to a process chamber; a concentration sensor disposed within the flow path for determining the concentration of at least one gas type within the gas mixture; and a controller to adjust the adjustable valves to control the flow of at least one gas type in accordance with the determined concentration of each gas type within the gas mixture.

In another aspect, embodiments of the invention can include method of controlling the concentration of one or more gases within a gas mixture, the method comprising: providing a plurality of gas sources, each source providing gas of a different gas type; causing gases from the plurality of gas sources to flow along a flow path so that the gases from the plurality of gas sources are combined into a gas mixture and delivered to a process chamber; providing a concentration sensor disposed within the flow path for determining the concentration of each gas type within the gas mixture; determining the concentration of at least one gas type within the gas mixture using the sensor; and adjusting an adjustable control valve within the flow path to control the flow for each different gas type in accordance with the determined concentration of each gas type within the gas mixture.

In yet another aspect, the invention may be a method of controlling the concentration of one or more gases within a gas mixture. First, a plurality of gases are provided, each gas provided by a gas source. Second, the plurality of gases are flowed along a flow path so that the plurality of gases are combined into a gas mixture and delivered to a process chamber, the flow path extending from the gas sources to the process chamber and fluidly coupled to a side stream, the side stream fluidly coupled to a vacuum source. A concentration sensor is provided, the concentration sensor fluidly coupled to the side stream and disposed between the vacuum source and the flow path. A concentration of a first gas within the gas mixture is determined using the concentration sensor. Finally, an adjustable control valve within the flow path is adjusted to control the flow of a second gas of the plurality of gases in accordance with the determined concentration of the first gas within the gas mixture.

In another aspect, the invention may be a method of controlling the concentration of one or more gases within a gas mixture. First, a plurality of gases are provided, each gas provided by a gas source. Second, the plurality of gases are flowed along a flow path so that the plurality of gases are combined into a gas mixture and delivered to a process chamber, the flow path extending from the gas sources to the process chamber and fluidly coupled to a side stream, the side stream located between the gas sources and the process chamber. A concentration sensor is provided, the concentration sensor fluidly coupled to the side stream and disposed within the side stream. A concentration of a first gas within the gas mixture is determined using the concentration sensor. Finally, an adjustable control valve within the flow path is adjusted to control the flow of a second gas of the plurality of gases in accordance with the determined concentration of the first gas within the gas mixture.

In other aspects, the invention may be a method of controlling the concentration of one or more gases within a gas mixture. First, a plurality of gases are provided, each gas provided by a gas source. Second, the plurality of gases are flowed along a flow path so that the plurality of gases are combined into a gas mixture and delivered to a process chamber, the flow path extending from the gas sources to the process chamber and fluidly coupled to a side stream. A concentration sensor is provided, the concentration sensor fluidly coupled to the side stream. A concentration of a first gas within the gas mixture is determined using the concentration sensor. Finally, an adjustable control valve within the flow path is adjusted to control the flow of a second gas of the plurality of gases in accordance with the determined concentration of the first gas within the gas mixture.

The foregoing has outlined rather broadly and in a non-limiting fashion the features and technical advantages of the present invention in order that the detailed description of the invention that follows may be better understood. Additional features and advantages of the invention will be described hereinafter. It should be appreciated by those skilled in the art that the conception and specific embodiments disclosed may be readily utilized as a basis for modifying or designing other structures for carrying out the same purposes of the present invention. It should also be realized by those skilled in the art that such equivalent constructions do not depart from the scope of the invention as set forth in the appended claims.

BRIEF DESCRIPTION OF THE DRAWINGS

The present disclosure may be better understood, and its numerous features and advantages made apparent to those skilled in the art by referencing the accompanying drawings.

The accompanying drawings are not intended to be drawn to scale. In the drawings, each identical or nearly identical component that is illustrated in various figures is represented by a like numeral. For purposes of clarity, not every component may be labeled in every drawing.

DETAILED DESCRIPTION

Embodiments of the invention are directed at an improved fluid delivery system and method that directly controls the concentration of constituent components in a fluid mixture delivered, for example, to a process chamber. In particular embodiments, pressure of the fluid mixture within the process chamber is also directly controlled. Virtually all fluid delivery systems used in modern day semiconductor manufacturing make use of mass flow controllers to indirectly control concentration and pressure. According to embodiments of the invention, a concentration sensor capable of measuring concentration of all of the constituent components in a fluid mixture is used to provide signals used to vary the flow rate of constituent gases under a closed loop feedback system. In some embodiments, the signal output of one or more pressure sensors is also used to provide a signal used to vary the flow rate of constituent gases under a closed loop feedback system. By directly controlling these two extremely important process variables, embodiments of the present invention provide a significant advantage in measurement accuracy over the prior art, enable real-time process control, reduce system level response time, and allow for a system with a significant footprint reduction.

The following description and drawings are illustrative and are not to be construed as limiting. Numerous specific details are described to provide a thorough understanding. However, in certain instances, well known or conventional details are not described in order to avoid obscuring the description. As the term is used herein, a "fluid" can be any type of matter in any state that is capable of flow, including liquids, gases, and slurries. For reasons of simplicity and clarity, much of the description herein will be directed at gases and gas mixtures, although it should be understood that embodiments described herein could be applicable to any type of fluid delivery system and are not limited to gas delivery systems.

Figure 1:
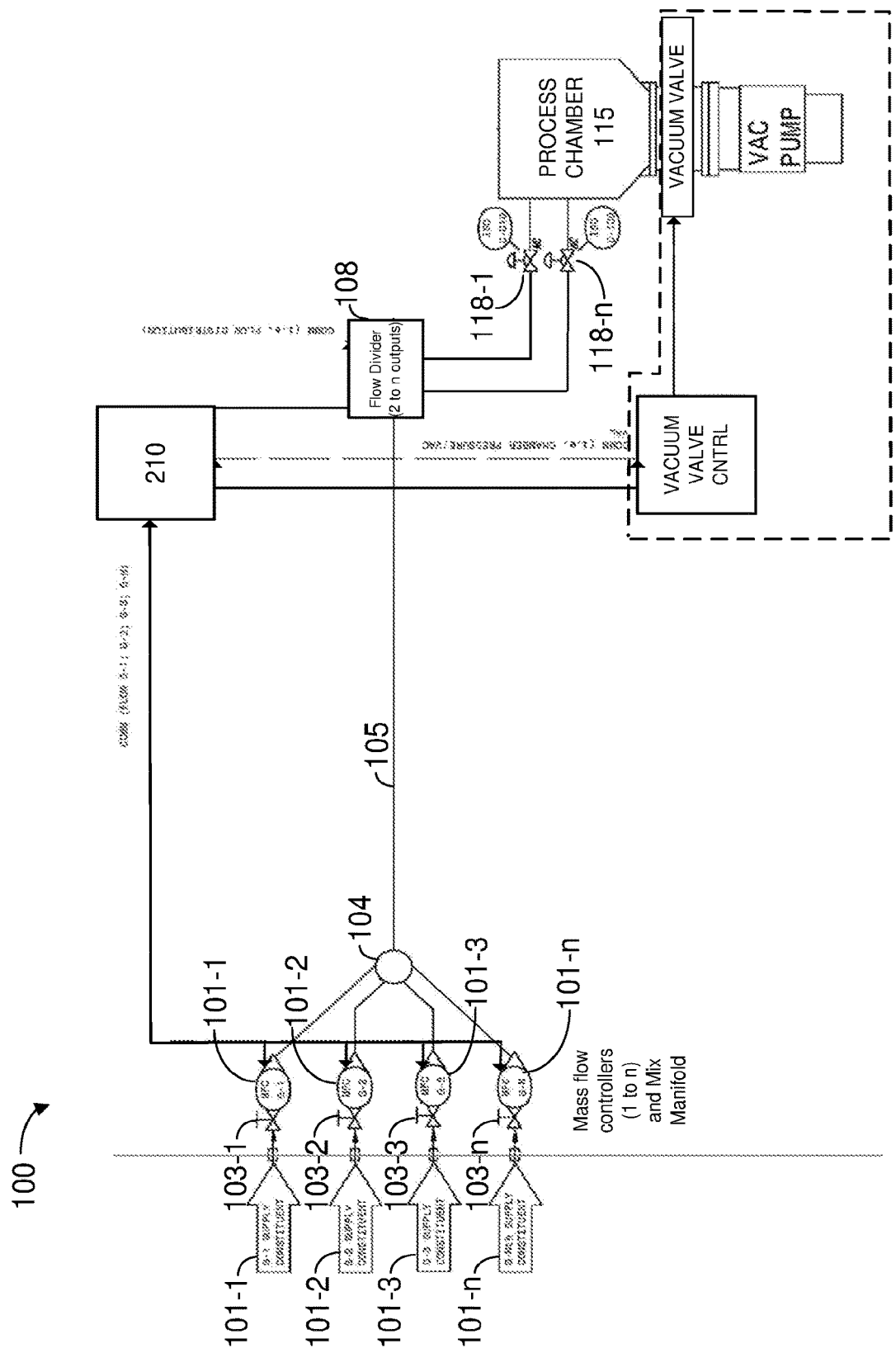
FIG. 1 shows a typical prior art fluid delivery system.

FIG. 1 shows a typical prior art fluid delivery system 100. A plurality of gas supplies 101 are controlled as to mass (or volume) flow rate over time by gas mass flow controllers 102. Gas from these MFCs can pass to a mixing manifold 104, and the resulting gas mixture flows through gas conduits 105 to the process chamber 115. Flow rates for each of the gases are controlled by variable flow valves 103 under the control of feed-back control loop. Control electronics 120 receive signals from each of the MFCs indicative of the flow rate through each sensor. A control signal is generated based upon the difference between the set point for desired gas flow and the feedback signal indicating the actual mass flow rate sensed by each MFC. Variable flow valves 103 positioned in the fluid flow path of the constituent gases (typically downstream of mass flow sensor) can be controlled (e.g., opened or closed) to vary the mass flow rate of each of the constituent gases. Typically, at least one additional MFC is positioned downstream from the mixing manifold to control overall flow of the gas mixture.

Significantly, the set point for desired gas flow must be calculated so that the combined mass flows of each constituent gas will combine to form a gas mixture having the desired concentrations. While such calculation methods are well known and used almost universally in all present day semiconductor manufacturing, mathematical modeling and/or calculations are never 100% accurate. Inherent sources of error in the use of modern MFCs to measure and control any type of fluid flow have long been recognized, as illustrated by the numerous patent applications filed each year directed to improvements in the use of MFCs. In addition, as the number of gases in a desired mixture increases, the sum of errors associated with each accumulates and the resultant mixture deviates increasingly from the desired concentration. And yet, the exclusive use of MFCs for regulating fluid flow, especially gas flow, into process tools remains ubiquitous in semiconductor fabrication.

Although contrary to accepted wisdom in the art, Applicants have realized that significant advantages may be achieved through direct control of the concentration of constituent gases in a gas mixture. Accordingly, embodiments of the present invention use one or more concentration sensors to directly measure gas concentration and to provide a signal used to vary the flow rate of constituent gases under a closed loop feedback system. Some embodiments also use pressure sensors to directly measure process chamber gas pressure and to provide a signal used to vary the flow rate of constituent gases under a closed loop feedback system. By eliminating the use of multiple MFCs to control gas flow rates, measurement accuracy can be significantly increased. In some embodiments, measurement accuracy for concentration of constituent gases will be less than 100 PPM, such as less than 60 PPM, less than 40 PPM, less than 20 PPM, or less than 10 PPM Eliminating the numerous MFCs found in a typical prior-art system will also allow embodiments of the present invention to have a significantly smaller footprint.

Figure 2:
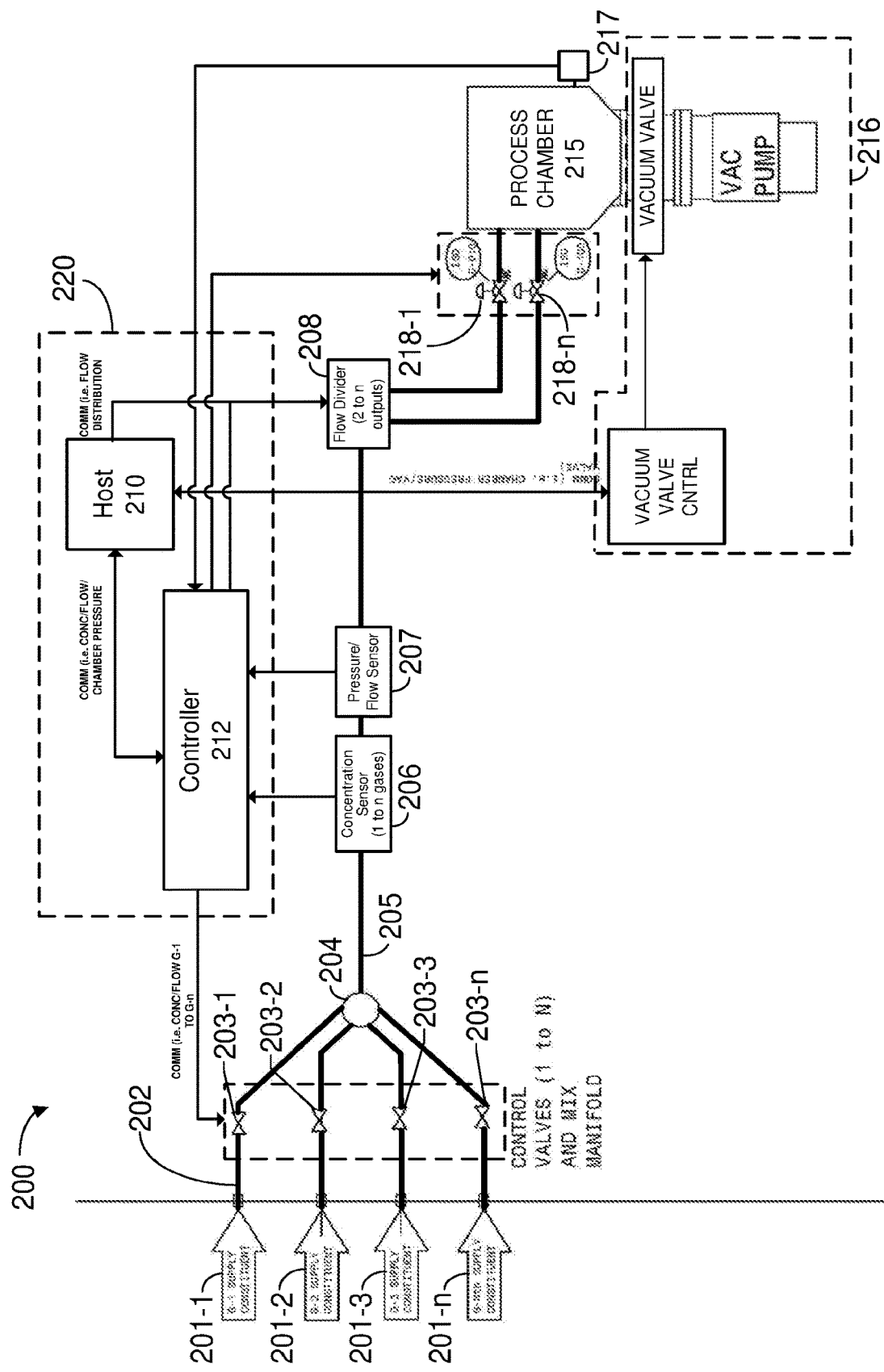
FIG. 2 is a schematic view of a fluid delivery system according to an exemplary embodiment of the present invention.

FIG. 2 is a schematic view of an exemplary embodiment of the present invention. Fluid delivery system 200 includes a plurality of gas sources 201-1 to 201-$n$ (collectively 201) for providing a gas mixture to process chamber 215 via gas conduits 205. Gas will flow from gas sources (the "upstream" end of the flow path) to the process chamber (the "downstream" end of the flow path) by virtue of the fact that the gas from gas sources 201 is at a higher pressure than the process chamber. As would be understood by those of ordinary skill in the art, there are a variety of methods to provide this pressure differential across fluid delivery system 200. For example, in the embodiment of FIG. 2, vacuum system 216 is used to lower the pressure inside process chamber 215, which is not only required for various processing steps such as plasma etching but also creates a significant pressure differential across the system.

Figure 3:
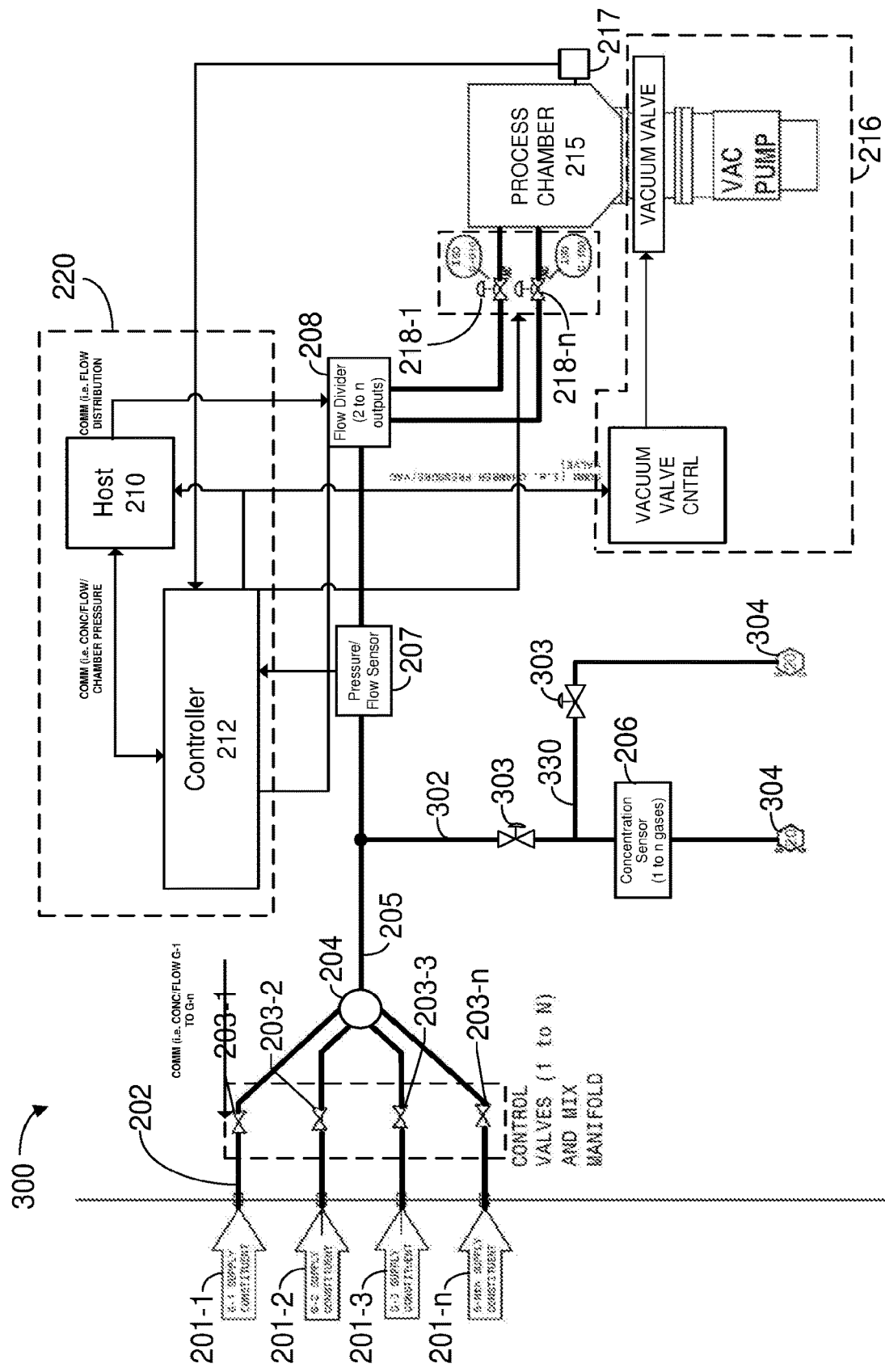
FIG. 3 is a schematic view of a fluid delivery system according to another exemplary embodiment of the present invention.

The plurality of gas sources 201 provide the constituent gases for a gas mixture. Any suitable types of gas source could be used, including gas cylinders, bulk storage tanks, a pipeline, or a direct gas supply or generation facility. Four different gas sources are illustrated in FIG. 3 ($201.sub.1$, $201.sub.2$, $201.sub.3$, . . . $201.sub.n$) but any number of gas sources could be used. For example, a mixture of HBr, $NF_3$, $O_2$, and $SF_6$ could be delivered to a process chamber for deep trench plasma etching of silicon during semiconductor manufacturing.

Gas sources 201 are coupled to mix manifold 204 by constituent gas conduits 202 and adjustable control valves 203-1 to 203-$n$ (collectively 203). Gas conduits can be formed from any material suitable for containing the gases that flow there through, for example, 316L electro-polished stainless steel tubing. The size of the conduits typically depends on the amount of gas flow there through. For example, 0.25 inch (0.635 cm) tubing is typical. Embodiments of the invention could also be implemented via modular gas blocks as is known in the art.

Adjustable control valves 203 control the flow of gas from the gas sources 201 to mix manifold 204 where the constituent gases combine to form a gas mixture, which then flows out of mix manifold 204 via the downstream gas supply line 205. In some embodiments, the constituent gases are mixed to form a homogenous gas mixture. Mix manifold 204 is designed to blend the different constituent gases and generate a homogeneous gas mixture in a short flow path. In some embodiments, mix manifold 204 can comprise a static gas mixer which generates intense turbulence in the flow. In some cases, one or more helically shaped elements can be housed in mix manifold 204 to function as a turbulence generator. In some embodiments, an outer turbulence generator, which is designed to trip the laminar flow gas (higher-flow carrier) into turbulent flow, can be used to create an unstable flow condition, which accelerates mixing. In some embodiments, an injector can be positioned within the flow path to increase the flow velocity of a lower flow gas and direct it 90 degrees from the overall carrier gas flow.

Adjustable control valves 203 are preferably proportional control valves, capable of continuous adjustment through a range between fully open and fully closed. In FIG. 2, adjustable control valves 203 are shown as pneumatic valves but any other type of valve (or combination of types) known in the art may be used as long as the flow of gas can be controlled to a desired degree of accuracy. Adjustable control valves 203 may be operated by way of valve actuators, examples of which include solenoid actuators, piezoelectric actuators, stepper actuators, etc.

Concentration sensor 206 is positioned within the fluid flow path so that it receives the gas mixture from gas supply line 205. In the embodiment of FIG. 2, concentration sensor 206 is positioned in-line with the primary gas flow path from the mix manifold to the process chamber. Alternatively, in system 300 shown in FIG. 3, concentration sensor 206 could be positioned on a slip-stream 302 (side stream) of the gas flow path, with gas being drawn through concentration sensor 206 by vacuum source 304 and then vented via an exhaust (not shown). In some embodiments, a restrictor and shut-off valve 303 can be used to control the pressure of the gas/fluid passing through the concentration sensor. Restrictor and shut-off valve 303 can be a single device as shown in FIG. 2, although in other embodiments restrictor and shut-off valve 303 can comprise a fixed or tunable orifice and a separate shut-off valve. As the terms are used herein, a concentration sensor will be considered to be within the fluid flow path in either of these embodiments, even if the gas flowing through the concentration sensor does not actually travel to the process chamber.

In particular embodiments, concentration sensor 206 is a mass spectrometer, although other types of concentrations sensors could also be used, including, for example, an ultrasonic sensor or an optical sensor using Fourier transform infrared spectroscopy and/or Near-infrared spectroscopy. In some embodiments, concentration sensor 206 is a sensor capable of determining the concentration for any constituent gases in a mixture, even for mixtures containing a large number of different constituents.

A mass spectrometer used as a concentration sensor generates an ion current from a portion of the gas mixture, accelerates it, and passes it through a mass filter to be received by a detector which outputs a signal according to the intensity of this ion current. Real-time signal from the mass spectrometer can include a full spectrum of atomic mass (for example up to 200 AMU), only specific mass ranges, or just single masses. In some embodiments, the concentration sensor can be a quadrupole mass spectrometer. By calibrating the mass spectrometer using calibration gas compounds with known concentration and comparing the signal intensity of the sample gas, concentration sensor 206 can provide a detailed chemical analysis of the sample gas, including the concentration of all constituent gases. For example, mass spectrometer calibration can be accomplished by intermittently flowing each constituent gas at 100% concentration (i.e. without any other gas present in the flow path). This allows the mass spectrometer to confirm atomic mass unit of each gases isotope(s) and calibrate the amplitude of the current for that isotope when at 100% concentration. The calibration can be done on all gases in series, periodically for a single gas, or periodically by rotating the calibration gas such that all constituents are regularly calibrated.

In the embodiment shown in FIG. 3, bypass line 330 is positioned on slip-stream 302 so that it is downstream from shut-off valve 303 but upstream from concentration sensor 206. This by-pass line allows all or most of the gas in the slip-stream to be vented very quickly, which is especially useful for concentration sensors that require a relatively small flow of gas through the sensor itself.

In the embodiment of FIG. 2, flow sensor 207 is positioned within the fluid flow path and used to measure the flow rate of the gas mixture. In the embodiment of FIG. 2, flow sensor 207 can be any suitable type of sensor that can be used to measure the amount of gas flowing along the primary fluid flow path to the process chamber, such as, for example, a thermal mass flow sensor, a Coriolis flow meter, or a pressure sensor such as a choked flow pressure sensor or laminar differential pressure sensor. In particular embodiments, one or more chamber pressure sensors 217 (e.g., manometers) can be positioned within the process chamber itself. As described in more detail below, in some embodiments either flow sensor 207 or chamber pressure sensors 217 will be present, but not both. In other embodiments, both types of sensors may be present. As described below, in some embodiments flow sensors and/or pressure sensors can be used only as a control parameter to control total gas flow but are not used as a control parameter for the feedback control loop used to adjust the ratio of gases in the gas mixture.

Process chamber 215 is the destination for the gas mixture exiting the fluid flow path. Once inside process chamber 215, the gas mixture is used to process sample materials placed within the process chamber 215 for this purpose. Such processing may include etching, deposition, chemical bonding, coating, reacting, and the like. As an example, the gas mixture can be used to plasma etch silicon during semiconductor manufacturing. Process chamber 215 should be a vessel of sufficient size to hold the materials to be treated. The construction of process chambers, such as those used in semiconductor manufacturing, are well known in the art.

In particular embodiments, two or more downstream control valves 218-1 to 218-*n* (collectively 218) can be used to control the portion of the gas mixture flow that is directed to different areas or zones within the process chamber. For example, in some instances it might be desirable to direct 75% of the process gas (gas mixture) to the edges of the sample to be processed and 25% of the process gas to the center of the sample. The gas flow path can be split using a flow divider 208 with downstream control valves 218 controlling the flow through each of the split lines. The split lines can be introduced into the process chamber using known supply line positioning and arrangements to direct the process gas to the two different zones as desired. As described above with respect to adjustable control valves 203, downstream control valves 218 can also be proportional control valves, capable of continuous adjustment operated by way of valve actuators.

Control electronics 220 control the position of the control valve in accordance with a set point indicating the desired concentration for each constituent gas in the gas mixture, and electrical signal output from the concentration sensor indicative of the actual measured concentration for each constituent gas. Control electronics 220 generally include a controller 212 coupled to host computer 210 having a processor and memory. Details of such devices (e.g., processor, memory, data storage, input and output devices) are well known and are omitted for the sake of clarity. Controller 212 may be realized by software, nonvolatile memory, hardware and/or firmware or combinations thereof, and it may include non-transitory processor readable instructions that effectuate the methods described further herein.

According to an embodiment, controller 212 is generally configured to generate a control signal to control the position of an adjustable control valve based upon the output signal from a sensor (such as concentration sensor 206) and to communicate that control signal to the adjustable control valve. A sensor, such as concentration sensor 206, typically produces a raw signal indicative of a particular characteristic, such as concentration of a particular constituent gas. The raw signal is communicated to the control electronics where it is typically conditioned, that is, it is normalized, linearized, and compensated for dynamic response.

The conditioned signal is then provided to controller 212, along with a set point signal (typically provided by the host computer 210) indicating a desired concentration level for each constituent gas. Based upon the difference between the sensor signal and the set point signal (the error signal) for each gas in the mixture, controller 212 generates a drive signal for each of the adjustable control valves. In some embodiments, traditional feedback control methods are used to produce the drive signal such as proportional control, integral control, proportional-integral (PI) control, derivative control, proportional-derivative (PD) control, integral-derivative (ID) control, and proportional-integral-derivative (PID) control.

Once generated, the drive signals are communicated to the valve actuators controlling each of the adjustable control valves 203. In response to the drive signals, the valve actuators cause the adjustable control valves to open or close, thus increasing or decreasing the gas flow through a particular valve. By changing the ratio of the flow rates of the different constituent gases entering the mixing manifold, the composition of the gas mixture (i.e., the concentration of each constituent) can be adjusted to a desired concentration level for each gas in the mixture.

In addition to controlling the ratio of constituent gases in the mixture, which can be thought of as an "inner" control loop, the amount of gas entering the process chamber (usually expressed as pressure) must also be controlled. The total gas flow can be thought of as an "outer" control loop. Controller 212 can also be configured to receive an output signal from flow sensor 207 or from pressure sensors 217 and to generate a control signal to control the position of adjustable control valves 203 based at least in part upon the sensor signal output in the same fashion as described above. In particular embodiments, however, any drive signal or modification to a drive signal generated from the flow sensor signal output and the flow set point will be uniformly applied to all constituent gas control valves. In other words, flow sensor or pressure sensor signal output is used only as a part of the outer control loop to increase or decrease the total flow of the gas mixture and does not change the ratio of constituent gases or the percentage of the gas mixture made up by any individual constituent gas.

In some embodiments, chamber pressure sensors 217 are used to provide the feedback signal for use in controlling the flow rate of constituent gases and/or for controlling the vacuum valve for the process chamber by way of the vacuum valve controller. The use of such chamber pressure sensors is desirable in that it allows for direct control of a critical process variable (gas pressure within the process chamber). In some embodiments, a flow sensor such as a thermal flow sensor or Coriolis flow meter may also be present in the system to allow mass flow of the gas to be monitored (for example to provide reference information or to provide an indication of a decay in pump performance or changes to energy levels within the chamber), but the output from these flow sensors is not used as a control parameter for the inner feedback control loop used to control the flow of gas from the gas sources as described above. Embodiments of the present invent thus completely eliminate mass flow as an inner loop control parameter for adjusting the adjustable control valves individually to control the ratio of gases in the gas mixture. Feedback from chamber pressure sensors and/or mass flow sensors can be used as an outer loop control parameter only to increase or decrease the total flow of the gas mixture by uniformly adjusting all constituent gas control valves.

In some embodiments, flow sensor output (including chamber pressure sensor output) could also be used to control downstream control valves 218 to adjust the chamber pressure down (by reducing total gas flow) or even up (when excess gas flow is available and being shunted, for example, to an exhaust).

In particular embodiments, the adjustable control valves can be driven in a feed-forward control mode. Fixed setpoint commands can be sent directly to each control valve, bypassing the feedback logic described above. In some instances, specific setpoints can, for example, cause the gas mixture to flow at a much higher rate than would be needed during system operation in order to populate the process chamber quickly upon system startup. In some embodiments, the flow rate used for rapid filling can be more than 50% of the maximum flow rate for each adjustable valve consistent with the desired constituent gas concentrations, such as more than 60%, more than 75%, more than 90%, or more than 99%. This allows for a substantial reduction of system response time on startup over the prior art. In a typical prior art system that only indirectly controls concentration and pressure by using MFCs to control the mass flows of the constituent gases, the set point for desired gas flow is typically entered at system startup and not varied. Large changes to the total volume of gas flow can produce undesirable variations in the concentration of the constituent gases. As a result, the ratio of constituent gases could not be guaranteed during a rapid fill at system startup. According to embodiments of the present invention, however, because concentration is directly measured and used as a control parameter, total gas flow can be easily increased (to quickly fill the process chamber to a desired pressure) while maintaining the desired concentrations for all constituent gases.

During such a rapid fill at system startup, the specific setpoints to be used during the rapid fill process can be determined in a number of different ways. For example, in some embodiments adjustable control valves 203 (which control the flow rates of the different constituent gases entering the mixing manifold) can be adjusted by an amount proportional to the desired concentration level for each gas in the mixture. Thus, for a mixture of three gases where the desired ratio is 60/20/20, the first valve could be opened to 60% of its full scale and the other two valves opened to 20% of full scale. In some circumstances, this type of simplistic setpoint determination may be sufficient, even though the method will likely result in significant errors in gas ratio as the total flow will be highly dependent on the full scale of each valve.

In other embodiments, the individual setpoints can be adjusted to take the full scale of each valve into consideration according to the following formula:

Setpoint for each valve=setpoint ratio*total flow/valve full scale

In the example above, with setpoints of 60, 20 and 20%, assume that the first valve has a full scale of 1000 sccm, the second valve has a full scale of 600 sccm, and the third has a full scale of 500 sccm. The adjusted setpoints using the formula would be 60%*1000/1000=60% for the first valve; 20%*1000/600=33.3% for the second valve; and 20%*1000/500=40% for the third valve.

In some embodiments, the individual setpoints can also be adjusted to take into account the types of gases being mixed. Full scale valve flows are typically determined using nitrogen as a calibration gas. To calculate the flow for a different gas, the reported full scale flow can be adjusted by the appropriate conversion factor. Conversion factors for various process gases are well known in the art.

Figure 4:
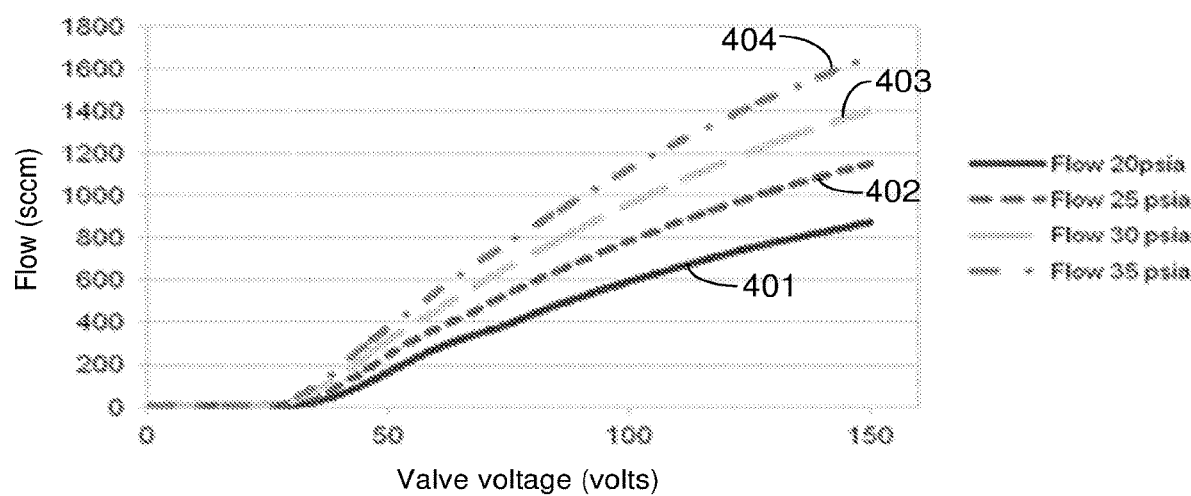
FIG. 4 shows typical characterization curves for flow vs. voltage for the same valve and gas at various inlet pressures.

In some embodiments, actual characterization curves for the vales and the actual gas at different inlet pressures to pick the optimal starting setpoint position. FIG. 4 shows typical characterization curves for flow vs. voltage for the same valve and gas at inlet pressures of 20 psia (401), 25 psia (402), 30 psia (403), and 35 psia (404). Characterization curves for each process gas can be stored in system memory. At system startup, individual setpoints can be calculated in actual gas flow (sccm), for example by using one of the methods described above. Using the measured inlet pressure, the system controller can then use the appropriate stored curve (closest to the actual measured inlet pressure) to determine the appropriate valve voltage for the desired calculated flow.

In some embodiments, previous setpoints used by the system can also be stored in data and used to predict correct valve setpoints for specific conditions encountered by the system. When similar conditions are detected, the stored setpoints can be sent to the control valves without waiting for the feedback control loop to operate. Once the first feedback is received and the controller is engaged to operate the adjustable control valves, the normal feedback control modes described herein can be engaged and the calculated setpoints and/or characterization curves not be used for the reminder of the system operation.

A system, method, or computer program product according to embodiments of the present invention has many novel aspects. Because the invention can be embodied in different systems, methods, or computer program products for different purposes, not every aspect need be present in every embodiment. Moreover, many of the aspects of the described embodiments may be separately patentable. The figures described herein are generally schematic and do not necessarily portray the embodiments of the invention in proper proportion or scale unless otherwise stated.

The invention described herein has broad applicability and can provide many benefits as discussed and shown in the examples herein. The embodiments will vary greatly depending upon the specific application, and not every embodiment will provide all of the benefits and meet all of the objectives that are achievable by the invention. Note that not all of the activities described above in the general description or the examples are required, that a portion of a specific activity may not be required, and that one or more further activities may be performed in addition to those described. Still further, the order in which activities are listed are not necessarily the order in which they are performed.

As will be appreciated by one skilled in the art, aspects of the present invention may include a system, method, or computer program product embodied entirely in hardware or in a combination of software and hardware. The program environment in which one embodiment of the invention may be executed illustratively incorporates one or more general-purpose computers or special-purpose devices such handheld computers. Details of such devices (e.g., processor, memory, data storage, input and output devices) are well known and are omitted for the sake of clarity.

Furthermore, aspects of the present invention may take the form of a computer program product embodied in at least one physical (e.g., non-transitory) computer-readable medium having computer-readable program code embodied thereon. The computer-readable medium may be a computer-readable signal medium, including but not limited to an electronic, magnetic, optical, electromagnetic, infrared, or semiconductor system, apparatus, or device, or any suitable combination thereof, or a computer-readable storage medium, including but not limited to an electronic, magnetic, optical, electromagnetic, infrared, or semiconductor system, apparatus, or device, or any suitable combination thereof. More specific non-limiting examples of the computer-readable storage medium would include the following: an electrical connection having at least one wire, portable computer diskette, hard disk, random access memory (RAM), read-only memory (ROM), erasable programmable read-only memory (EPROM or Flash memory), optical fiber, portable compact disc read-only memory (CD-ROM), optical storage device, magnetic storage device, or any suitable combination thereof. As used herein, a computer-readable storage medium may be any tangible medium that can contain, or store a program for use by or in connection with an instruction execution system, apparatus, or device.

Computer program code for carrying out operations for aspects of the present invention may be written in any combination of at least one programming language. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

It should also be understood that the techniques of the present invention might be implemented using a variety of technologies. Computer-program instructions may be provided to a processor of a general purpose computer, special purpose computer, or other programmable data processing apparatus to produce a special purpose machine for implementing the functions/acts specified in the flowchart and/or block diagram blocks. The computer-program instructions may also be loaded onto a computer, other programmable data processing apparatus, or other device to cause a series of operational steps to be performed to produce a computer-implemented process such that the instructions which execute on the computer or other programmable apparatus provide processes for implementing embodiments of the invention.

The figures herein illustrate the architecture, functionality, and operation of possible implementations of systems, methods, and/or computer program products according to various embodiments of the present invention. As such, each block in any flowchart or block diagrams may represent a module, segment, or portion of code comprising at least one executable instruction for implementing the specified logical function(s). It should also be noted that, in some alternative embodiments, the order in which the blocks are listed are not necessarily the order in which the functions or activities noted in the block are performed. For example, two blocks shown in succession may be executed substantially concurrently, or the blocks may sometimes be executed in the reverse order, depending upon the functionality involved. It will also be noted that each block and/or combinations of blocks in the diagrams and/or flowcharts can be implemented by special purpose hardware-based systems that perform the specified functions or acts, by or combinations of special purpose hardware and computer program instructions.

The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments described herein were chosen and described in order to best explain the principles of the invention and the practical application, and to enable others of ordinary skill in the art to understand the invention for various embodiments with various modifications as are suited to the particular use contemplated.

In the foregoing specification, the concepts have been described with reference to specific embodiments. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of invention. After reading the specification, skilled artisans will appreciate that certain features are, for clarity, described herein in the context of separate embodiments, may also be provided in combination in a single embodiment. Conversely, various features that are, for brevity, described in the context of a single embodiment, may also be provided separately or in any subcombination.

Reference in this specification to "one embodiment" or "an embodiment" means that a particular feature, structure, or characteristic described in connection with the embodiment is included in at least one embodiment of the disclosure. The appearances of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not other embodiments.

Further, references to values stated in ranges include each and every value within that range. Whenever the terms "automatic," "automated," or similar terms are used herein, those terms will be understood to include manual initiation of the automatic or automated process or step.

As used herein, the terms "comprises," "comprising," "includes," "including," "has," "having" or any other variation thereof, are intended to cover a non-exclusive inclusion. For example, a process, method, article, or apparatus that comprises a list of features is not necessarily limited only to those features but may include other features not expressly listed or inherent to such process, method, article, or apparatus. Further, unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present). Also, the use of "a" or "an" are employed to describe elements and components described herein. This is done merely for convenience and to give a general sense of the scope of the invention. This description should be read to include one or at least one and the singular also includes the plural unless it is obvious that it is meant otherwise.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

Although the present invention and its advantages have been described in detail, it should be understood that various changes, substitutions and alterations can be made to the embodiments described herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of controlling the concentration of one or more gases within a gas mixture, the method comprising:
    providing a plurality of gases, each gas provided by a gas source;
    causing the plurality of gases to flow along a flow path so that the plurality of gases are combined into a gas mixture and delivered to a process chamber, the flow path extending from the gas sources to the process chamber and fluidly coupled to a side stream, the side stream fluidly coupled to a vacuum source;
    providing a concentration sensor fluidly coupled to the side stream, the concentration sensor disposed between the vacuum source and the flow path;
    determining a concentration of a first gas within the gas mixture using the concentration sensor; and
    adjusting an adjustable control valve within the flow path to control the flow of a second gas of the plurality of gases in accordance with the determined concentration of the first gas within the gas mixture.

2. The method of claim 1 wherein the first and second gases are the same.

3. The method of claim 1 wherein the first and second gases are different.

4. The method of claim 1 wherein the step of adjusting further comprises adjusting a plurality of adjustable control valves within the flow path to control the flow of more than one gas of the plurality of gases.

5. The method of claim 1 wherein the step of determining comprises determining concentrations of a plurality of gases within the gas mixture using the sensor.

6. The method of claim 1 wherein the step of causing comprises using calculated setpoints to deliver the gas mixture to the process chamber at a first flow rate, the first flow rate being higher than a second flow rate used during system operation.

7. The method of claim 1 wherein the step of causing comprises using calculated setpoints to deliver the gas mixture to the process chamber at a first flow rate that is more than 50% of a maximum flow rate for the adjustable control valve.

8. The method of claim 1 wherein a first valve is fluidly coupled to the side stream and disposed between the concentration sensor and the flow path.

9. The method of claim 1 wherein the side stream further comprises a bypass line.

10. The method of claim 9 wherein a second valve is fluidly coupled to the bypass line.

11. The method of claim 9 wherein the bypass line is fluidly coupled to a vacuum source.

12. A method of controlling the concentration of one or more gases within a gas mixture, the method comprising:
    providing a plurality of gases, each gas provided by a gas source;
    causing the plurality of gases to flow along a flow path so that the plurality of gases are combined into a gas mixture and delivered to a process chamber, the flow path extending from the gas sources to the process chamber and fluidly coupled to a side stream, the side stream located between the gas sources and the process chamber;
    providing a concentration sensor fluidly coupled to the side stream, the concentration sensor disposed within the side stream;
    determining a concentration of a first gas within the gas mixture using the concentration sensor; and
    adjusting an adjustable control valve within the flow path to control the flow of a second gas of the plurality of gases in accordance with the determined concentration of the first gas within the gas mixture.

13. The method of claim 12 wherein the step of adjusting further comprises adjusting a plurality of adjustable control valves within the flow path to control the flow of more than one gas of the plurality of gases.

14. The method of claim 12 wherein the step of determining comprises determining concentrations of a plurality of gases within the gas mixture using the sensor.

15. The method of claim 12 wherein the step of causing comprises using calculated setpoints to deliver the gas mixture to the process chamber at a first flow rate, the first flow rate being higher than a second flow rate used during system operation.

16. The method of claim 12 wherein a first valve is fluidly coupled to the side stream and disposed between the concentration sensor and the flow path.

17. The method of claim 12 wherein the side stream further comprises a bypass line.

18. The method of claim 17 wherein a second valve is fluidly coupled to the bypass line.

19. The method of claim 17 wherein the bypass line is fluidly coupled to a vacuum source.

20. A method of controlling the concentration of one or more gases within a gas mixture, the method comprising:
- providing a plurality of gases, each gas provided by a gas source;
- causing the plurality of gases to flow along a flow path so that the plurality of gases are combined into a gas mixture and delivered to a process chamber, the flow path extending from the gas sources to the process chamber and fluidly coupled to a side stream;
- providing a concentration sensor fluidly coupled to the side stream;
- determining a concentration of a first gas within the gas mixture using the concentration sensor; and
- adjusting an adjustable control valve within the flow path to control the flow of a second gas of the plurality of gases in accordance with the determined concentration of the first gas within the gas mixture.

\* \* \* \* \*